United States Patent [19]

Baba et al.

[11] Patent Number: 5,126,817
[45] Date of Patent: Jun. 30, 1992

[54] DIELECTRICALLY ISOLATED STRUCTURE FOR USE IN SOI-TYPE SEMICONDUCTOR DEVICE

[75] Inventors: Yoshiro Baba; Yutaka Koshino, both of Yokohama; Akihiko Osawa, Machida; Kenji Yamawaki, Zama, all of Japan

[73] Assignees: Kabushiki Kaisha Toshiba, Kawasaki; Tokuda Seisakusho Co., Ltd., Kanagawa, both of Japan

[21] Appl. No.: 596,286

[22] Filed: Oct. 12, 1990

[30] Foreign Application Priority Data

Oct. 13, 1989 [JP] Japan .................. 1-265266

[51] Int. Cl.⁵ ............... H01L 27/12; H01L 27/02; H01L 27/04; H01L 29/06
[52] U.S. Cl. .................... 357/49; 357/47; 357/50; 357/55
[58] Field of Search .......... 357/49, 47, 50, 55

[56] References Cited

U.S. PATENT DOCUMENTS 4,710,794 12/1987 Koshino et al. .......... 357/49
4,984,052 1/1991 Koshino et al. .......... 357/47

Primary Examiner—Rolf Hille
Assistant Examiner—Wael Fahmy
Attorney, Agent, or Firm—Finnegan, Henderson, Farabow, Garrett and Dunner

[57] ABSTRACT

A dielectrically isolated structure for use in an SOI-type semiconductor device according to the present invention comprises a substrate having an element-forming region formed therein on a first insulating film, the region being made of a first material, at least one trench formed in the element-forming region and extending to the first insulating film, second insulating films formed on side walls of the trench, and a film made of a second material, and embedded in only an upper portion of the trench such that a bottom portion of the trench is hollow.

7 Claims, 6 Drawing Sheets

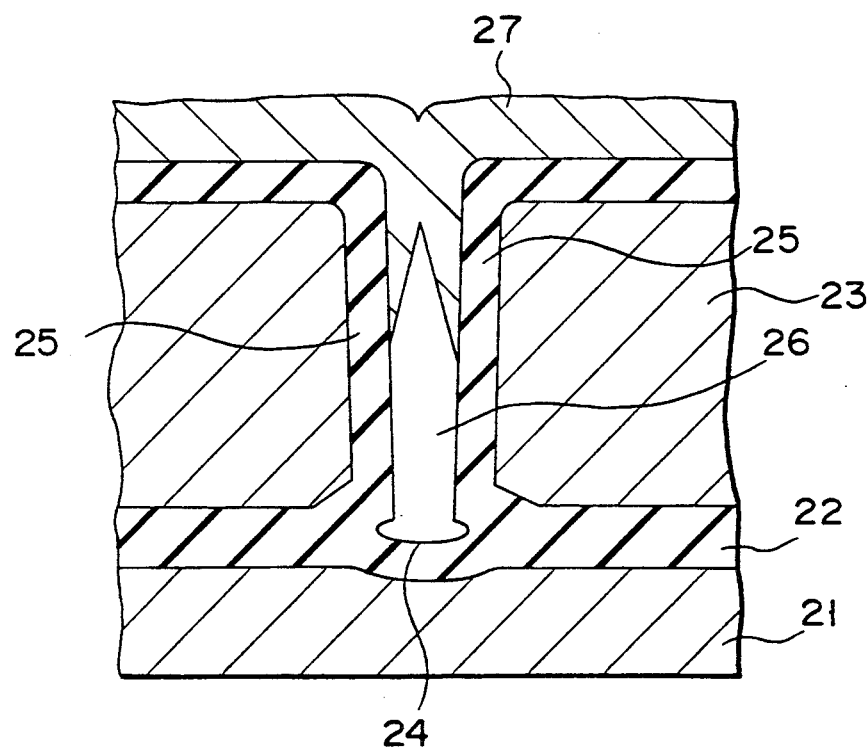
F I G. 4

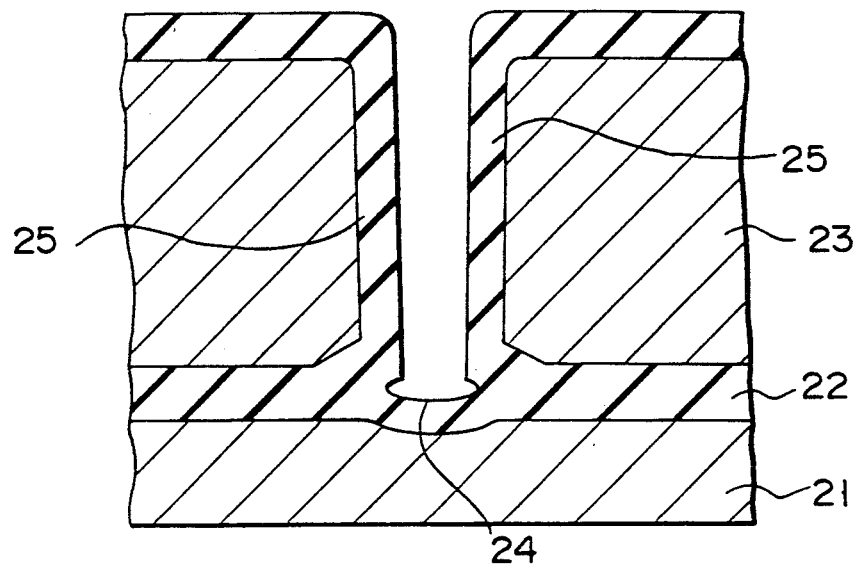
F I G. 5A
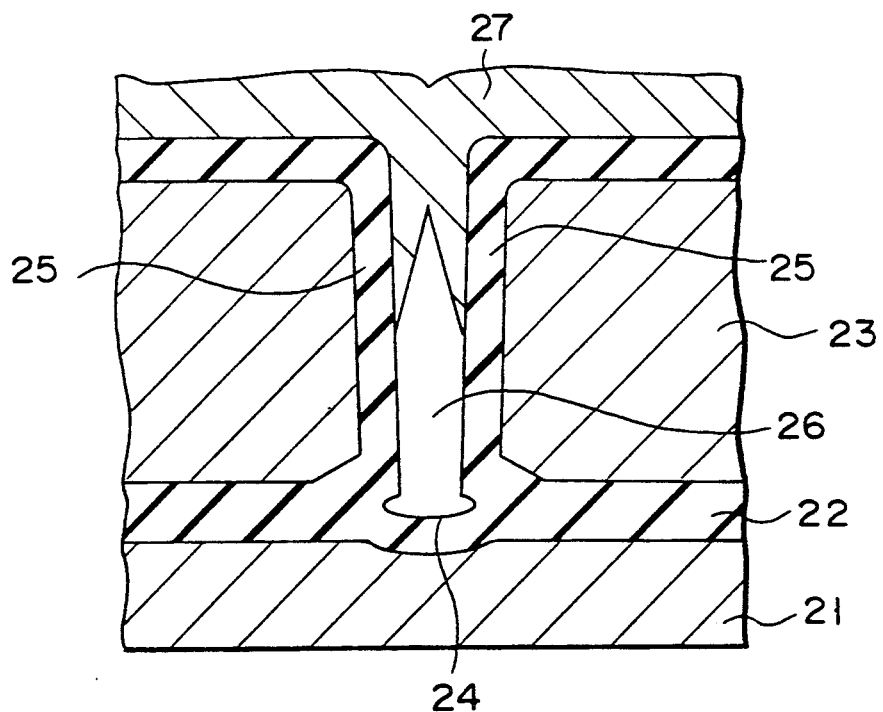
F I G. 5B

DIELECTRICALLY ISOLATED STRUCTURE FOR USE IN SOI-TYPE SEMICONDUCTOR DEVICE

BACKGROUND OF THE INVENTION

1. Field of the Invention

This invention relates to an improved, dielectrically isolated structure for use in SOI-type semiconductor devices, in particular, in intelligent power devices.

2. Description of the Related Art

FIGS. 1A through FIG. 1D are a process flowchart explaining of the manufacturing a completely dielectrically-isolated substrate for use in an SOI-type semiconductor device, which is now under study. The process comprises four steps, i.e., trench-forming, corner-rounding, embedding, and levelling.

In the trench-forming step shown in FIG. 1A, an oxide film 12, having a thickness of about 1.5 $\mu$m, is formed on a silicon (Si) substrate 11. Then, the substrate 11, covered with the film 12, and another silicon (Si) substrate 13 are bonded together by means of wafer-bonding technique. The substrate 13 is abraded by a grinder or the like, thus obtaining a desired thickness of, e.g. 20±5 $\mu$m. Subsequently, a masking layer 14, made of $SiO_2$ and being about 2.3 $\mu$m thick, is applied over the substrate 13. Thereafter, PEP (Photo Etching Process) is performed. Specifically, the silicon substrate 13 is etched by RIE (Reactive Ion Etching), thereby forming a trench 15 extending to the oxide film 12 and having a width of about 2.0 $\mu$m.

In the corner-rounding step shown in FIG. 1B, the corners of the side walls of the trench 15 are rounded by, for example, CDE (Chemical Dry Etching) using $CF_4$ (freon).

In the embedding step shown in FIG. 1C, the chip is thermally oxidized at about 1050° C. in the atmosphere of oxygen, thereby forming an oxide film 17 on the side wall of the trench 15. Then, a polysilicon film 16 is deposited over the entire surface of the chip by the use of, for example, CVD (Chemical Vapour Deposition) under a reduced pressure of 1 Torr or less. At this time, the polysilicon film 16 is embedded in the trench 15.

In the levelling step shown in FIG. 1D, the etchback of the polysilicon film 16 is performed by, for example, the aforementioned CDE, thus levelling the surface of the silicon substrate 13. Thereafter, an oxide film is applied over the entire surface of the substrate 13, thereby obtaining a dielectrically isolated substrate.

In the above-described steps, it is most important to minimize crystal defect occurring at the corners of the bottom of the trench 15. To this end, the corner-rounding process is provided, as is shown in FIG. 1B.

FIG. 2A shows the shape of a trench formed in a dielectrically isolated substrate manufactured by a process including no corner-rounding steps. FIG. 2B shows the shape of a trench formed in a dielectrically isolated substrate manufactured through a process including a corner-rounding step shown in FIG. 1B.

The dielectrically isolated substrate shown in FIG. 2B has trenches each having its bottom, formed by the oxide film 12, undercut. In the embedding step after the oxidization of the side walls of the trenches, a polysilicon film 16 is deposited on the entire surface of the chip, whereby the trenches 15 are completely filled with polysilicon. Thus, the corners of the trench bottom, formed by the oxide film 12, are completely filled with polysilicon, which reduces crystal defect occurring at the corners.

However, it is known that even the above-described dielectrically isolated substrate does not have a sufficiently high breakdown voltage.

FIGS. 3A and 3B show manners of measuring the breakdown voltage of such a dielectrically isolated substrate, and FIG. 3C shows the measurement results.

It is considered that the thickness of the oxide film 17, formed on the side walls of a trench, greatly affects the breakdown voltage of the dielectrically isolated substrate. Hence, we prepared substrates having side-wall films 17 of thicknesses of 4000, 6000, and 8000 Å. We then measured the breakdown voltage between the adjacent element regions in each substrate, as is shown in FIG. 3A, and that between a base plate and element regions in each substrate, as is shown in FIG. 3B.

As can be understood from FIG. 3C, the breakdown voltage obtained is proportional to the thickness of the side-wall oxide film 17, and lower than each of the values required for the substrates of the given thicknesses. Specifically, only a breakdown voltage of about 600 V was obtained from the substrate having trenches each insulated by a bottom oxide film 12 of 1.6 $\mu$m, and a side-wall oxide film 17 of 0.8 $\mu$m (=8000 Å) (accordingly, the sum thickness of the films formed on the both side walls of a trench is 16000 Å).

However, in this case, the breakdown voltage must be, in theory, at least about 1400 V.

SUMMARY OF THE INVENTION

It is the object of this invention to provide a dielectrically isolated structure for use in SOI-type semiconductor devices, which can provide sufficiently high breakdown voltage suitable for the thickness of the side wall of a trench.

To attain the above object, the dielectrically isolated structure of the invention comprises a substrate having an element-forming region formed therein on a first insulating film, the region being made of a first material; at least one trench formed in the element-forming region and extending to the first insulating film; second insulating films formed on side walls of the trench; and a film made of a second material, and embedded in only an upper portion of the trench such that a bottom portion of the trench is hollow.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 is a sectional view of a dielectrically isolated structure for use in SOI-type semiconductor devices, according to an embodiment of the invention;

FIGS. 5A and 5B are sectional views useful in explaining a process for manufacturing the dielectrically isolated structure shown in FIG. 4.

DETAILED DESCRIPTION OF THE PREFERRED EMBODIMENTS

Figure 1A:
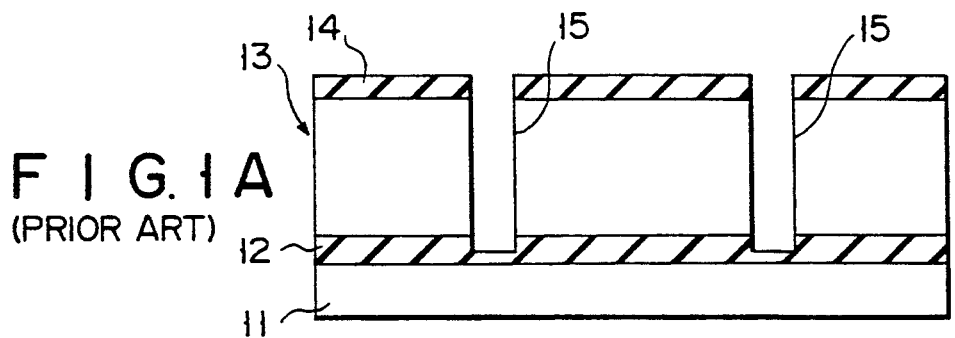
FIGS. 1A through 1D are a process flowchart explaining the manufacturing of a conventional completely dielectrically-isolated substrate.

This invention will now be explained in detail with reference to the accompanying drawings showing an embodiment thereof.

FIG. 4 shows the dielectrically isolated structure for use in the SOI-type semiconductor device of this invention.

A silicon oxide film (first insulating film) 22 is formed on a monocrystal silicon substrate 21. Another substrate 23 made of monocrystal silicon (first material) is formed on the film 22. The substrate 23 has a trench 24 extending therethrough to the film 22. The corners of the trench 24 are rounded. A side wall oxide film (second insulating film) 25 is formed on the side wall of the trench 24. The trench 24 has an upper portion in which a polysilicon film (second material) 27 is embedded, and a lower hollow portion 26 filled with air. Thus, the polysilicon film 27 does not cover the undercut of the oxide film 22 at the bottom of the trench 24.

A method of manufacturing the dielectrically isolated substrate will be explained with reference to FIGS. 5A and FIG. 5B.

As is shown in FIG. 5A, the silicon oxide (SiO₂) film 22 having a thickness of about 1.5 μm is applied over the monocrystal silicon (Si) substrate 21. Then, the substrate 21, covered with the film 22, and the monocrystal substrate 23 are bonded together by means of a wafer-bonding technique. Thereafter, the substrate 23 is abraded by a grinder or the like, thus obtaining a desired thickness, e.g. 20+5 μm. A masking member made of SiO₂ and having a thickness of about 2.3 μm is applied over the substrate 23 abraded. Subsequently, PEP (Photo Etching Process) is performed. Specifically, the substrate 23 is etched by RIE (Reactive Ion Etching), thereby forming the trench 24 extending to the silicon oxide film 22. The corners of the trench 24 are rounded by, for example, CDE (Chemical Dry Etching). Further, the side wall oxide (SiO₂) film 25 is applied to the wall surface of the trench 24 by thermal oxidization at a temperature of about 1050° C. in the atmosphere of oxygen.

Then, as is shown in FIG. 5B, a film made of a material having a thermal expansion coefficient substantially equal to the monocrystal silicon, such as the polysilicon film 27, is deposited over the entire surface by, for example, CVD. The film 27 is controlled to be deposited such that the amount of deposition decreases from the upper portion of the wall of the trench 24 to the lower portion. That is, the film 27 is embedded only in the upper portion of the trench 24 to thereby form the hollow portion 26 at the bottom. This can be performed by controlling the atmospheric pressure to, for example, normal pressure, when the polysilicon film 27 is deposited, thereby making the mean free path of silicon molecule, obtained by the thermal decomposition of SiH₄, shorter than the depth of the trench 24.

Subsequently, the etchback of the polysilicon film 27 is carried out by, for example, the CDE, thereby levelling the monocrystal silicon substrate 23. Finally, an oxide film is applied over the entire surface, to complete the dielectrically isolated substrate. These etchback process and oxide film-forming process are not shown.

In this way, since the polysilicon film 27 is deposited on the wall of the trench 24 with the mean free path of a silicon molecule made short, the hollow portion 26 can be formed at the bottom of the trench 24.

Figure 1B:
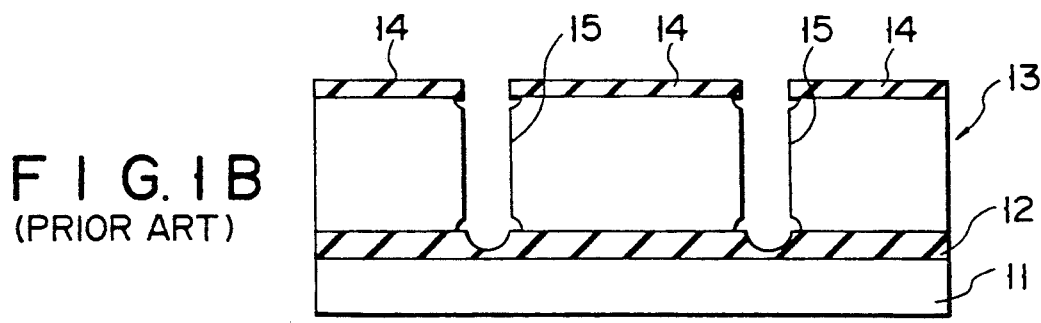
Figure 1C:
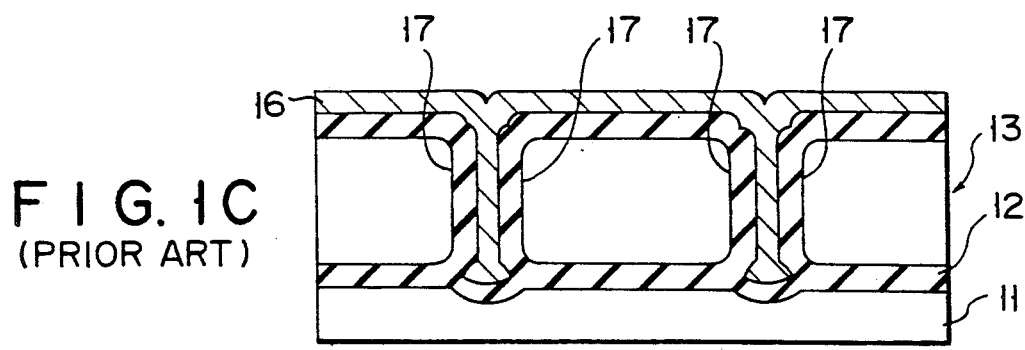
Figure 1D:
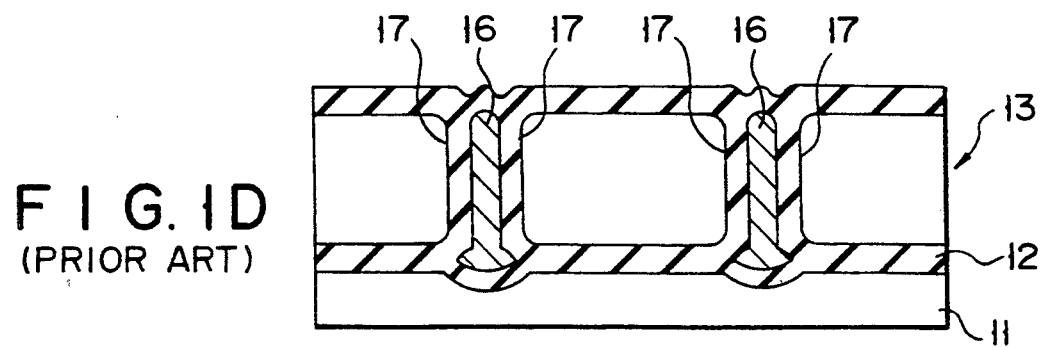
Figure 2A:
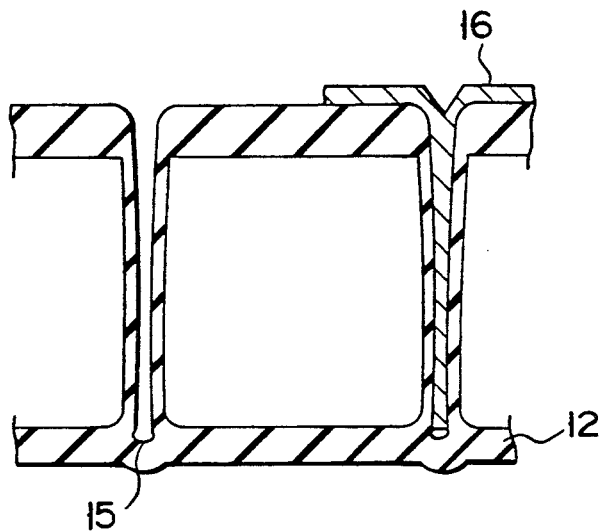
FIGS. 2A and 2B show trenches formed in conventional dielectrically isolated substrates.
Figure 2B:
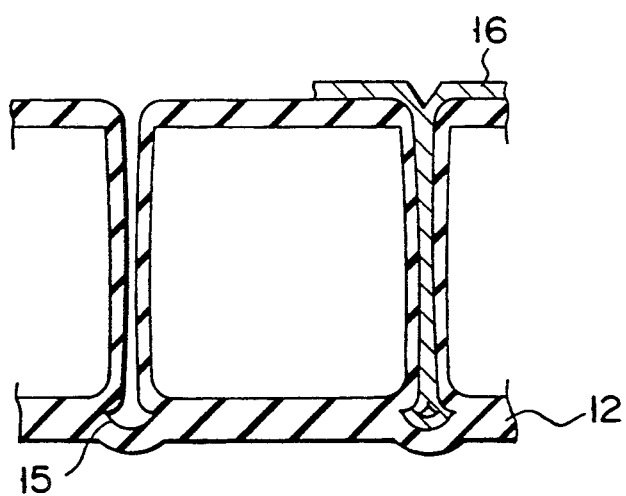
Figure 3A:
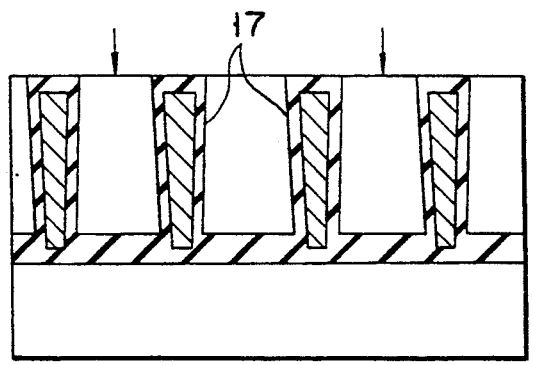
FIGS. 3A through 3C are views useful in explaining the breakdown voltages of conventional dielectrically isolated substrates.
Figure 3B:
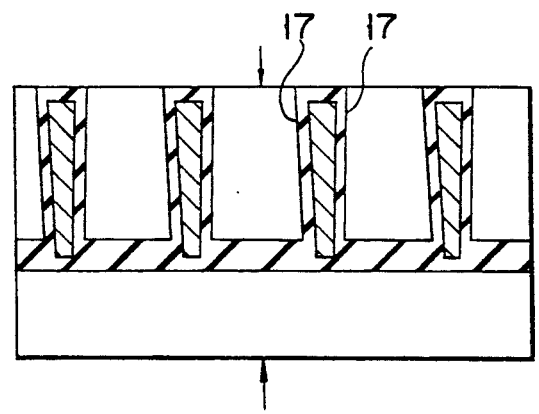
Figure 3C:
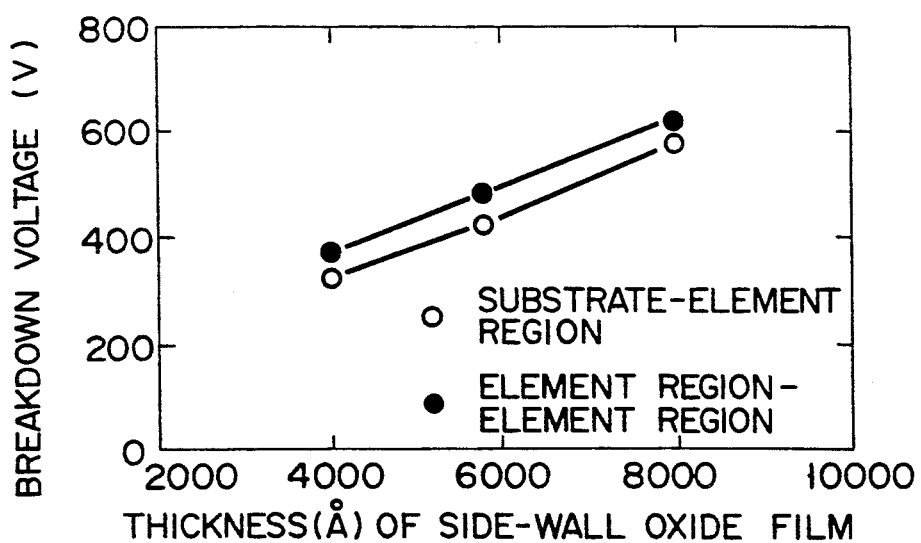

As is aforementioned, the dielectrically isolated substrate, manufactured through a process including the corner-rounding step shown in FIG. 1B, can have a breakdown voltage of about 1400 V, if the side-wall oxide film 17 is about 0.8 μm (=8000 Å) thick. However, the actual breakdown voltage is about only 600 V. This is because the polysilicon fills up the undercut corners (formed by the oxide film 22) of the bottom of the trench 24, thereby causing a concentrated electric field.

Figure 6C:
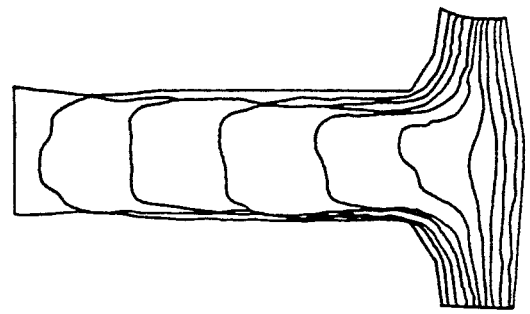
FIGS. 6A through 6C are views useful in comparing a potential distribution in a trench having a bottom portion filled with air, with that in a trench filled up with polysilicon.
Figure 6B:
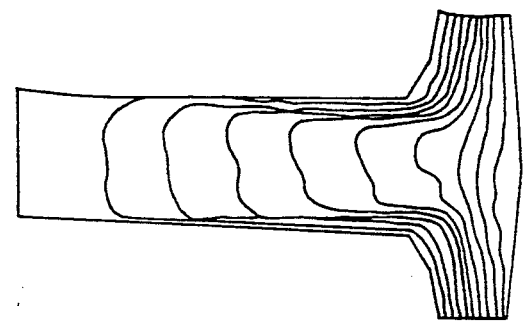
Figure 6A:
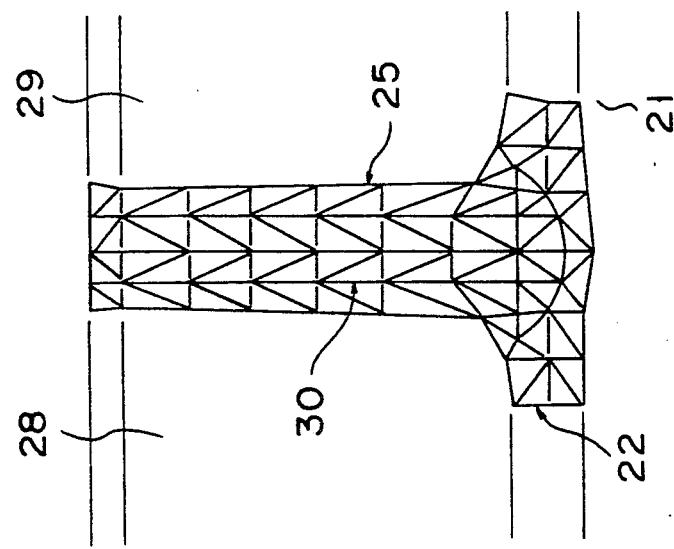

FIGS. 6A through 6C are views useful in comparing a potential distribution in a trench 24 having a bottom hollow portion 26 filled with air, with that in a trench 24 completely filled with polysilicon (i.e., the undercut corners of the trench bottom, formed by the oxide film 22, is completely filled with polysilicon). FIG. 6A is a subregion diagram to be used for solving Poisson's equation by the use of finite element method. In this figure, 21 denotes the monocrystal silicon substrate, 22 the bottom oxide film, 25 the side-wall oxide film, 28 and 29 element-formed regions, and 30 a material to be filled in the trench.

In the experiments, 1000 V was applied to the element regions 28 and 29, and at the same time 0 V was applied to the monocrystal silicon substrate 21, in order to analyze the potential distribution within the trench 24. Then, we found that in the substrate which had trenches each having a hollow portion (dielectric constant=1.0) at its bottom, equipotential lines (the difference between each two adjacent lines is 100 V) were distributed not so tightly at the corners of the trench, as is shown in FIG. 6B. On the other hand, in the substrate which had trenches each having undercut corners completely filled with polysilicon (dielectric constant=11.7), equipotential lines were distributed tightly at the corners, as is shown in FIG. 6C, indicating that the electric field was intense at the corners. Consequently, we confirm that the structure of this invention with the hollow portion 26 formed at the bottom of the trench 24, is advantageous, since it minimize the electric concentration at the bottom and corners of the trench, and hence increases the breakdown voltage of the substrate.

Although polysilicon (27) is embedded in the trench 24 in the embodiment, SIPOS, SiN, BPSG, PSG, or the like can be embedded therein.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A dielectrically isolated structure for use in an SOI-type semiconductor device, comprising:
    a substrate having an element-forming region on a first insulating film, the region being made of a first material;
    at least one trench in the element-forming region, the trench having an upper portion and a lower portion, and the trench extending to the first insulating film;
    second insulating films on side walls of the trench; and
    a film made of a second material in only the upper portion of the trench such that the lower bottom portion of the trench is hollow.

2. The dielectrically isolated structure according to claim 1, wherein the first insulating film is a silicon oxide film.

3. The dielectrically isolated structure according to claim 1, wherein the first material is monocrystal silicon.

4. The dielectrically isolated structure according to claim 1, wherein the second insulating film is a silicon oxide film.

5. The dielectrically isolated structure according to claim 1, wherein the second material has a coefficient of thermal expansion substantially equal to that of the first material.

6. The dielectrically isolated structure according to claim 1, wherein the second material is polysilicon.

7. The dielectrically isolated structure according to claim 1, wherein the trench has corners in the lower portion, the corners in the lower portion being rounded.

* * * * *